United States Patent [19]
Allis

[11] Patent Number: 5,400,786
[45] Date of Patent: Mar. 28, 1995

[54] MRI MAGNETS

[75] Inventor: Jonathan L. Allis, Iffley, England

[73] Assignee: Oxford Magnet Technology Limited, Oxford, United Kingdom

[21] Appl. No.: 177,821

[22] Filed: Jan. 4, 1994

[30] Foreign Application Priority Data

Apr. 8, 1993 [GB] United Kingdom ............... 9307368

[51] Int. Cl.⁶ .................... A61B 5/055; G01R 33/38
[52] U.S. Cl. .................. 128/653.2; 128/653.5; 324/318; 324/319; 324/320; 335/296; 335/302; 335/299
[58] Field of Search ............ 128/653.2, 653.5; 324/300, 309, 318, 319, 320; 335/216, 296, 299, 302

[56] References Cited

U.S. PATENT DOCUMENTS

| | | | |
|---|---|---|---|
| 4,490,675 | 12/1984 | Knuettel et al. | 324/318 |
| 4,587,490 | 5/1986 | Müller et al. | 324/320 |
| 4,695,802 | 9/1987 | Zijlstra | 324/319 |
| 4,703,276 | 10/1987 | Beer | 324/319 |
| 4,707,663 | 11/1987 | Minkoff et al. | 324/319 |
| 4,710,741 | 12/1987 | McGinley | 324/320 |
| 4,771,243 | 9/1988 | Vreugdenhil et al. | 324/319 |
| 4,931,760 | 6/1990 | Yamaguchi et al. | |
| 4,983,922 | 1/1991 | Tahara | 324/320 |
| 5,061,897 | 10/1991 | Danby et al. | 324/319 |
| 5,154,603 | 10/1992 | Sepponen | 128/653.2 |
| 5,296,811 | 3/1994 | Ehnholm et al. | 324/319 |

FOREIGN PATENT DOCUMENTS

| | | |
|---|---|---|
| 0216404 | 4/1987 | European Pat. Off. |
| 60-151545 | 8/1985 | Japan |
| 61-200451 | 9/1986 | Japan |
| 2814243 | 6/1987 | United Kingdom |
| 2262611 | 6/1993 | United Kingdom |
| 88/08126 | 10/1988 | WIPO |
| WO92/07278 | 4/1992 | WIPO |

Primary Examiner—Krista M. Pfaffle
Attorney, Agent, or Firm—Keck, Mahin & Cate

[57] ABSTRACT

An MRI magnet arrangement comprises, an annular electromagnet defined by a coil, an annular shim of magnetic material coaxially disposed within the coil, first permanent magnet means having a field, the direction of which is the same as the field of the coil, disposed coaxially within the said shim and second permanent magnet means disposed coaxially within the said first permanent magnet means, the field of which is arranged to be opposite in direction to the field produced by the said first permanent magnet means, the arrangement being such that the magnetic field produced in an imaging volume within the said second permanent magnet means is substantially homogeneous.

9 Claims, 1 Drawing Sheet

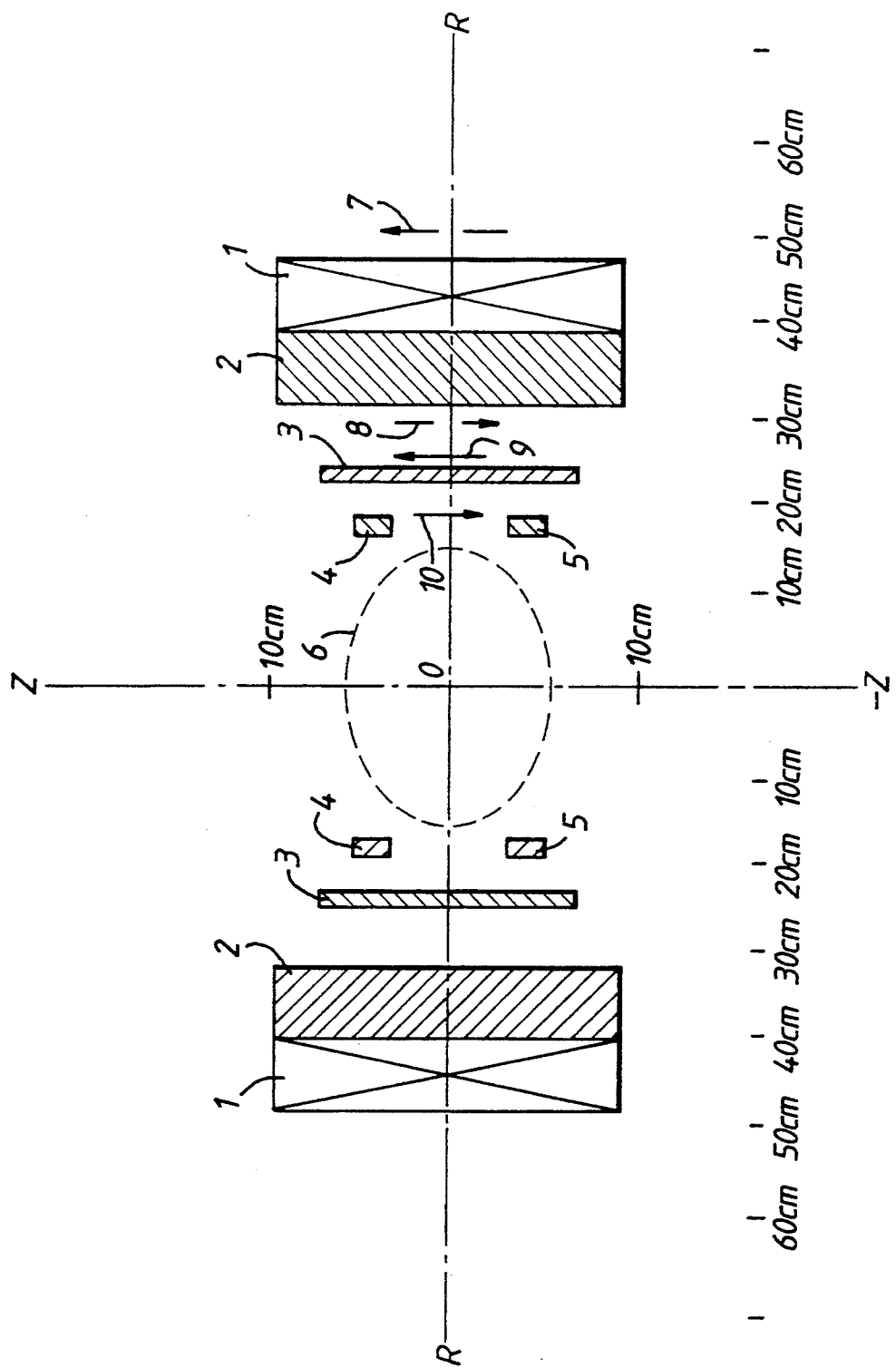

MRI MAGNETS

This invention relates to magnets of the kind used for magnetic resonance imaging (MRI) and more especially it relates to magnets having a short axial length.

In order to provide good image resolution, an MRI magnet must have a suitably sized region, known as the imaging volume, wherein the magnetic field is highly homogeneous such that harmonic coefficients appertaining to the field are substantially zero up to at least the eighth order.

High magnetic field homogeneity and a suitable sized imaging volume are comparatively easy to achieve in elongate annular magnets wherein the axial length of the magnet is long compared with the inner diameter of the magnet. Such magnets, having a length of about 2 meters and a clear bore diameter of about 1 meter, which may be cryogenic electro-magnets, are commonly used for whole body scanning apparatus.

Although these relatively long magnets are generally acceptable, short magnets are to be preferred for some diagnostic purposes such as interventional radiology, and mammography for example. Short magnets also increase the chance of scanning claustrophobic patients.

It is therefore an object of the present invention to provide a relatively short magnet which is suitable for use in MRI apparatus.

According to the present invention an MRI magnet arrangement comprises, an annular electro-magnet defined by a coil, an annular shim of magnetic material coaxially disposed within the coil, first permanent magnet means having a field, the direction of which is the same as the field of the coil, disposed coaxially within the said shim and annular magnetic material disposed coaxially within the said first permanent magnet means, the field of which is arranged to be opposite in direction to the field produced by the said first permanent magnet means, the arrangement being such that the magnetic field produced in an imaging volume within the said annular magnetic material is substantially homogeneous.

The annular magnetic material may comprise magnet means or alternatively it may comprise mild steel, which would be magnetised by the main magnetic field generated by the coils. This is probably a more cost-effective method of building the magnet than using a permanent magnet.

The imaging volume may be substantially elliptical.

The shim may be arranged to serve as a former on which the coil is wound and may be made of Silicon Iron (SiFe), laminated and slotted to remove eddy currents.

It is well known that the magnetic field due to a coil or ring of magnetic material may be written in terms of a series of Legendre polynomials. The coefficients in the series refer to particular orders of inhomogeneity in the magnetic field, and so one speaks of Z2, Z4, Z6, etc. The relative size of the harmonics Z2, Z4, Z6, etc due to a magnetic source depends strongly on the distance between the source and the point at which the magnetic field is measured. So for example in the magnet proposed in this patent, the electromagnetic coil produces large amounts of $-Z2$ a smaller amount of $+Z4$ and insignificant amounts of $-Z6$. The soft iron shim produces $+Z2$ and relatively more $-Z4$ and $+Z6$. The first permanent magnetic means produces $-Z2$ even more relative amounts of $+Z4$ and $-Z6$. The inner most annular magnetic material which may comprise a permanent megnet or mild steel means produces the largest ratio of high order (Z6, Z8, etc) to lower order (Z2) harmonics. The relative amounts of harmonics due to the various components of the magnet are played off against each other to achieve a relatively homogeneous magnetic field in which to perform magnetic resonance imaging.

The said first permanent magnet means may comprise one annular magnet.

The said annular magnetic material may comprise a pair of axially spaced annular magnets, symmetrically disposed with respect to the said first annular magnet means or alternatively mild steel or soft iron annuli.

The permanent magnets may be made of Neodymium Iron Boron (NbFeB), Samarium Cobalt (SmCo) or other suitable permanent magnetic material.

The annular shim of magnetic material may be made of soft iron.

One embodiment of this invention will now be described by way of example only with reference to the accompanying drawing, which is a somewhat schematic sectional view of a magnet.

Turning now to the drawing, (which is not precisely to scale, although dimensions are shown thereon to give a general idea of size), a magnet comprises an annular coil 1 which serves as an electro-magnet, the coil being wound on an annular soft iron shim 2 which is disposed coaxially within the coil 1. Disposed coaxially within the annular shim 2, there is provided an annular magnet 3, and within the annular magnet 3 there are provided two further annular magnets 4 and 5. The magnets 4 and 5 are symmetrically and coaxially disposed with respect to the annular magnet 3.

The arrangement is such that a resultant magnetic field is produced within the magnets 4 and 5 in an imaging volume as shown within a broken line 6, which is substantially homogeneous. This homogeneity of the field in the imaging volume, is achieved by arranging that the harmonic coefficients appertaining to the field are substantially zero up to at least the eighth order. In order to aid a better understanding of how this advantageous result is achieved, magnetic field contributions made by the individual parts will now be considered in more detail.

Referring again to the drawing, the coil 1 is arranged to produce a field having a direction as indicated by an arrow 7. As will be well understood by those skilled in the art, the dominant harmonic contributions afforded by this field are Z0 and $-Z2$. In order to shim out the unwanted Z2 harmonics the annular shim 2 is provided, but as well as compensating for $-Z2$ it additionally provides a significant contribution of the harmonic $-Z4$. The field due to the annular shim 2 is shown by the arrow 8. In order to shim out the $-Z4$ harmonic, the permanent magnet 3 is provided having associated with it a field the direction of which is indicated by an arrow 9. The magnet 3 is chosen so as to provide an equal and opposite contribution of the harmonic $-Z4$ introduced by the annular shim 2. It will be appreciated that the magnet 3 also makes a Z0 and $-Z2$ contribution which is taken account of in the sizing of the coil 1 and the annular shim 2. Additionally however, the magnet 3 makes a $-Z6$ harmonic contribution and a $+Z8$ harmonic contribution. In order to shim out these undesirable harmonics, the annular magnets 4 and 5 are provided which have associated with them a field as indicated by the arrow 10, the direction of which is in opposition to the field provided by the magnet 3. The effect of the magnets 4 and 5 is thus to reduce to substantially zero the harmonics Z8 and Z6.

In an alternative embodiment of the invention the magnets 4 and 5 may be replaced with soft iron or silicon iron annuli which may be laminated or slotted to reduce eddy currents.

By using the various component parts of the magnet as hereinbefore described progressively to shim out the significant even harmonics which are responsible for non-uniformities of field, a very short annular magnet has been produced having a substantially elliptical imaging volume which is eminently suitable for MRI mammography or orthopaedic applications. The annular magnet shown is capable of producing a substantially homogeneous field in the imaging volume of about 0.2T using Neodynium Iron Boron magnets and a soft iron annular shim.

With currently available permanent magnet materials, magnets according to the present invention are probably limited to relatively low field designs since-in the presence of high fields the permanent magnet material would tend to be de-magnetised.

Various modifications may be made to the arrangement just before described without departing from the scope of the invention, and for example, the precise number, size and position of the magnets used may be varied to achieve equivalent results.

I claim:

1. An MRI magnet arrangement comprises, an annular electromagnet defined by a coil having a field, an annular shim of magnetic material coaxially disposed within the coil, first permanent magnet means for producing a field, the direction of which is aligned with the field of the coil, disposed coaxially with the annular shim of the magnetic material, second permanent magnet means providing an imaging volume and being disposed coaxially within said first permanent magnet means, for producing a field which is arranged to be opposite in direction to the field produced by said first permanent magnet means, the arrangement being such that the magnetic field produced in the imaging volume within said second permanent magnet means is substantially homogeneous.

2. A magnet arrangement as claimed in claim 1, wherein said shim is a former on which the coil is wound.

3. A magnet arrangement as claimed in claim 2, wherein said first permanent magnet means comprises one annular magnet.

4. A magnetic arrangement as claimed in claim 3 wherein said second permanent magnet means comprises a pair of axially spaced annuli symmetrically disposed with respect to the said first permanent means.

5. A magnet arrangement as claimed in claim 4, wherein the said annuli are soft iron or Silicon iron.

6. A magnet arrangement as claimed in claim 1 wherein said second permanent magnet means comprises a pair of axially spaced annular magnets, symmetrically disposed with respect to the said first permanent magnet means.

7. A magnet arrangement as claimed in claim 1 wherein the first and second permanent magnet means are made of Neodynium Iron Boron (NbFeB).

8. A magnet arrangement as claimed in claim 1 wherein the annular shim of magnetic material is soft iron.

9. A magnetic resonance imaging system including means for supporting a body to be scanned; MRI magnet means for generating a homogenous magnetic field; means for obtaining MRI signals from the body in the magnetic field; and means for generating an MRI image from the obtained MRI signals; wherein the improvement of said MRI magnet means comprises:

an annular electromagnet defined by a coil having a field, an annular shim of magnetic material coaxially disposed within the coil, first permanent magnet means for producing a field, the direction of which is aligned with the field of the coil, disposed coaxially with the annular shim of the magnetic material, second permanent magnet means providing an imaging volume and being disposed coaxially within said first permanent magnet means, for producing a field which is arranged to be opposite in direction to the field produced by said first permanent magnet means, the arrangement being such that the magnetic field produced in the imaging volume within said second permanent magnet means is substantially homogenous.

* * * * *